United States Patent [19]

Podlesny

[11] 4,431,975

[45] Feb. 14, 1984

[54] OSCILLATOR CIRCUIT FOR ULTRASONIC CLEANING

[75] Inventor: Richard J. Podlesny, Morrisville, Pa.

[73] Assignee: Ultrasonic Power Corporation, Trenton, N.J.

[21] Appl. No.: 250,621

[22] Filed: Apr. 16, 1981

[51] Int. Cl.[3] .......................... H03B 5/36; H03B 5/00

[52] U.S. Cl. .......................... 331/117 R; 331/116 R; 310/316; 310/317

[58] Field of Search ........................ 331/116 R, 117 R; 310/314, 316, 317; 366/116

[56] References Cited

U.S. PATENT DOCUMENTS

| | | | |
|---|---|---|---|
| 3,325,747 | 6/1967 | Schrecongost | 331/117 X |
| 3,371,233 | 2/1968 | Cook | 310/317 |
| 3,617,923 | 11/1971 | Paradysz et al. | 331/116 R X |
| 3,736,523 | 5/1973 | Puskas | 331/116 R X |
| 4,018,706 | 3/1978 | Edelson | 310/316 |

*Primary Examiner*—Siegfried H. Grimm
*Assistant Examiner*—W. R. Paxman
*Attorney, Agent, or Firm*—Frederick A. Zoda; John J. Kane

[57] ABSTRACT

An improved oscillator circuit, adapted especially for use in generating multi-frequency wave patterns occurring within the ultrasonic range, incorporates a transistor base drive network in which an alternate discharge path is used for coupling capacitors already known in circuits of this type. Power losses occurring in the transistors are lessened by employing transistors having reverse base-emitter breakdown voltage ratings that are higher than those conventionally employed. Use of the substituted transistors becomes possible by substituting the mentioned alternate discharge path, to compensate for the lower average discharge current that is known to pass through the base-emitter circuits of the transistors by reason of their higher reverse base-emitter breakdown voltages. The improved circuit in this way reduces power loss and its consequent temperature rise in the transistors and in their base and emitter resistors to increase output power to the accompanying reduction of transistor losses.

5 Claims, 2 Drawing Figures

OSCILLATOR CIRCUIT FOR ULTRASONIC CLEANING

BACKGROUND OF THE INVENTION

1. Field of the Invention

The present invention may be generally classified in the field of oscillator circuitry, and more particularly, circuitry of this type specially adapted for use in simultaneous multi-frequency ultrasonic generators of the kind employed to resonate transducers associated with cleaning tanks in which articles are immersed in a liquid subjected to ultrasonic wave energy transmitted by the transducer or transducers.

2. Description of the Prior Art

It is already known to utilize the concept of resonating a transducer in a plurality of differing fundamental modes and their harmonics for transmitting, simultaneously, a multiplicity of frequencies in the ultrasonic range, through a liquid of a cleaning tank to which the transducer is attached. U.S. Pat. No. 3,371,233 issued to Edward G. Cook discloses this concept.

It has been found, however, that while this concept produces excellent results, and has found strong commercial acceptance, the oscillating circuitry embodied therein results in less output power than is truly desirable, in relation to the energy input to the oscillator. And, it is also considered that improved transistors, having higher reverse base-emitter breakdown voltage ratings, could be advantageously employed in the oscillation circuits, but for the fact that the present circuit configurations have a base drive network that is unsuitable for this purpose. Accordingly, while the existing circuitry as disclosed in the above mentioned patent is commercially acceptable, improvements therein are desirable for the purpose of making effective use of newly available transistor technology.

SUMMARY OF THE INVENTION

Summarized briefly, the present invention utilizes an oscillator circuit for simultaneous multi-frequency ultrasonic generators, in which transistors having high transverse base-emitter breakdown voltage ratings are employed, in association with an improved base drive network in which an alternative discharge path is substituted for coupling capacitors already incorporated in the circuit, to compensate for a lower averge discharge current through the base-emitter circuits of the transistors resulting from their higher reverse base-emitter breakdown voltage.

BRIEF DESCRIPTION OF THE DRAWING

While the invention is particularly pointed out and distinctly claimed in the concluding portions herein, a preferred embodiment is set forth in the following detailed description which may be best understood when read in connection with the accompanying drawings, in which:

DESCRIPTION OF THE PREFERRED EMBODIMENT

Figure 1:
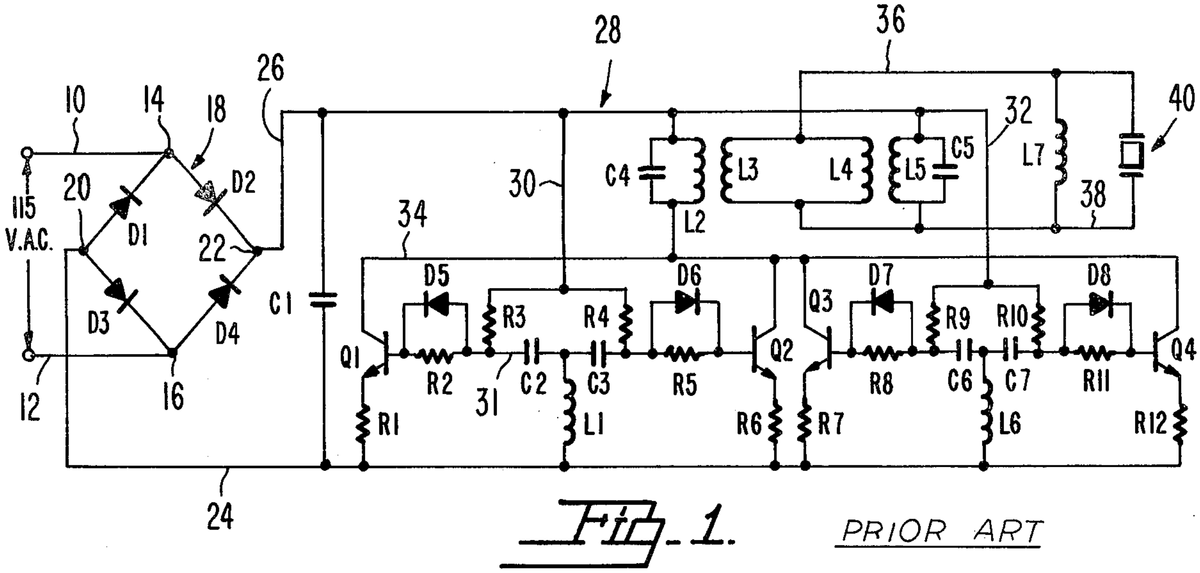
Fig. 1. PRIOR ART
FIG. 1 is a schematic view of a prior art circuit already in use in simultaneous multi-frequency ultrasonic generators.

In order to obtain a full appreciation of the nature and importance of the present improvement, it is considered desirable to first describe in detail a known prior art circuit used for the purpose of resonating a transducer in a plurality of differing fundamental modes (and their harmonics) simultaneously. FIG. 1 is an illustration of such a circuit.

In FIG. 1, there is shown a prior art circuit in which lines 10, 12 extend from a source of line voltage, in this case a single phase supply in which main power supply lines 10, 12 are extended from a 115 V.A.C. supply source. Lines 10, 12, extend to opposed terminals 14, 16 of a full wave bridge rectifier 18, having rectifiers D1, D2, D3, D4. Extending from the output terminals 20, 22 of the bridge rectifier are power supply leads 24, 26 through which the rectified voltage is applied to an oscillator circuit 28. This circuit, when used in a simultaneous multi-frequency ultrasonic generator, must be capable of oscillating from a voltage of near zero volts to a value equal to the peak of the rectified line voltage. A capacitor C1 is connected across the supply leads 24, 26, for the purpose of providing a low impedance power supply bypass at all oscillation frequencies. It may be observed that the capacitor is not of sufficient size to serve as a filter at twice power line frequency.

The oscillator circuit 28, the component values, and the transducer characteristics, are typically selected, in the prior art circuitry shown in FIG. 1, to produce multiple frequencies at the generator output. This inhibits the formation of standing waves in the cleaning tank and provides more uniform cleaning in relation to the depth of the tank.

The operation of the FIG. 1 prior art circuit may be readily understood, in that when voltage is applied thereto, resistors R3, R4, R9, and R10 bias transistors Q1, Q2, Q3, Q4 "on". A voltage thus appears across capacitors C4, C5 and windings L2, L5. As current starts to flow through the primary windings L2, L5 of the respective oscillator coils embodied in the illustrated circuit, a current is induced in the feedback windings of said coils, shown at L1 and L6 respectively. The feedback windings are wound upon the same oscillator coils as the respective primary windings L2, L5. The current thus imposed upon the feedback windings causes the transistors to turn "on" still further, until the circuit saturates.

Capacitors C4, C5 and primary windings L2, L5 form a tuned circuit which produces oscillations by causing the feedback windings L1 and L6 to alternately turn the transistors "on" and "off".

Incorporated in the circuit are feedback capacitors C2, C3, C6, C7. These are charged when the transistors are turned on, and are discharged when the transistors are turned off. The discharge current flowing from the transistors flows through the emitter resistors R1, R6, R7, R12, through the reverse biased base emitter junctions of transistors Q1, Q2, Q3, Q4, and through the base resistors R2, R5, R8, and R11, generating heat in all of these components. Heat is also generated in the transistors themselves, when the collector voltage and the collector current overlap.

The above constitutes a prior art circuit which has been found to work efficiently, when older transistor technology was used. Newer transistors are known, however, that have higher reverse base-emitter breakdown voltage ratings, resulting in marked efficiency of the oscillating circuit in the above described environment.

However, it has been found that in order to use transistors having these improved characteristics, a new base drive network must be developed, since the discharge path embodied in the prior art oscillating circuit described above, offers insufficient compensation for the lower average discharge current passing through the transistor base-emitter circuits as a result of their higher reverse base-emitter breakdown voltages.

Figure 2:
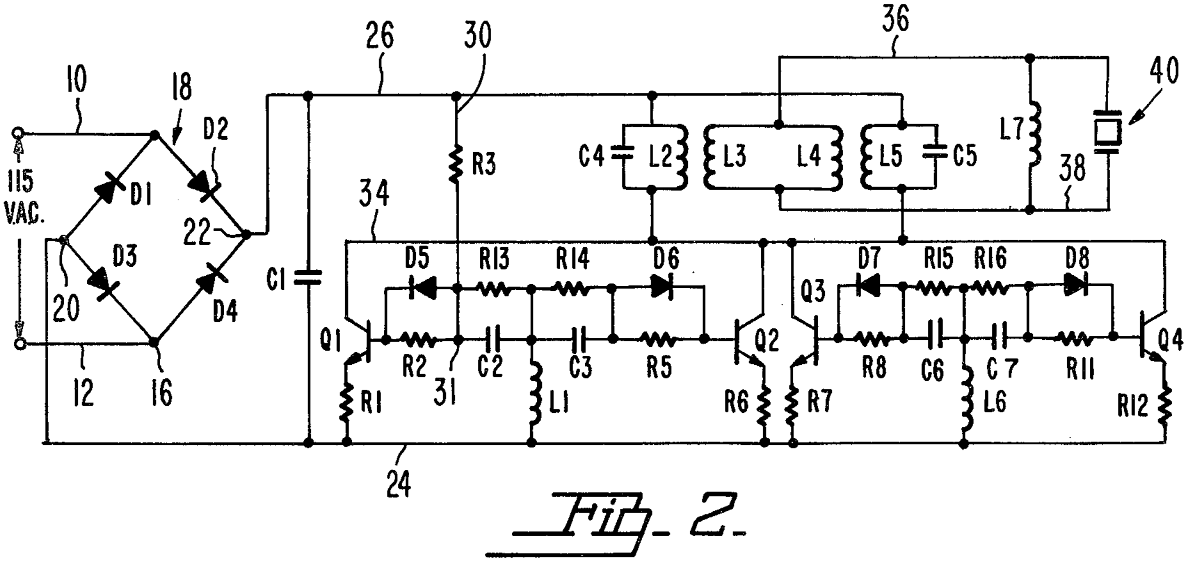
FIG. 2 is a similar view showing the improvements in said circuit.

In the improved circuit devised to offer this specific compensation, and shown in FIG. 2, the feedback capacitors C2, C3, C6, and C7 have a charge stored in them when the transistors are driven "on". In the next half cycle, these capacitors must be discharged, else they will bias the transistor bases negatively and thus prevent stable oscillation. The discharge currents flow through the base resistors R2, R5, R8, and R11, the transistors Q1, Q2, Q3, and Q4, and the emitter resistors R1, R6, R7, and R12 respectively. By increasing the base-emitter reverse breakdown voltage, less capacitor discharge current flows in the transistors, and less power is lost in the resistive elements as heat. Measurements of transistors Q1, Q2, Q3 and Q4 usable advantageously in the FIG. 2 circuitry, have revealed that their actual base-emitter breakdown voltages are in the range of 10 to 15 volts. These transistors are Type MJ-12010, a product of Motorola Semi-Conductor Products, Inc., Phoenix, Ariz. Accordingly, in the improved circuit, resistors R13, R14, R15, and R16 have been added in parallel with capacitors C2, C3, C6, and C7 respectively, to provide an alternate discharge path for the feedback capacitors. This replaces the discharge path in the original circuit which included the reverse breakdown of the transistors' base-emitter junctions. The higher reverse base-emitter breakdown voltage rating of the new transistors in and of itself reduces the discharge current which can flow in that path. It may be noted, in this regard, that resistor R3 is still connected in the circuit in the same manner, basically, as it was in the prior art circuit, being connected by lead 30 between the R2-C2 junction 31 and the power supply lead 26.

As noted, higher reverse base-emitter breakdown voltage ratings resulting from new and improved transistor technology effects a reduction of the discharge current flow in the path through the feedback capacitors. However, unless the feedback capacitors are substantially discharged during alternate half cycles of the driving wave form, unstable oscillator operation will occur. This is true especially during the low voltage "turn on" portion of each cycle of the power supply voltage. In the improved arrangement, most of the discharge current is diverted from the transistors. There is, thus, an effective reduction in power loss, and hence in temperature rise, in the transistors and in their base and emitter resistors. A consequent improvement in transistor reliability and oscillator power efficiency results.

The number of turns on the feedback windings L1 and L6 of the oscillator coils is proportioned in accordance with the base drive resistor-capacitor configuration shown in FIG. 2, and values are selected for these components to achieve the desired wave form for the base drive of the transistors. This change has increased output power while reducing power loss in the transistors. This particular improvement results by reason of a decrease in the overlap of the collectors' voltage and in the current wave form.

It may also be observed that in the FIG. 2 circuit configuration, it is possible to use only a single starting resistor R3. The resistors R4, R9, R10 are not needed. This is true because only one transistor is required to start the oscillations since all are interconnected by means of the parallel collector circuits and the primary windings of the oscillation transformers. The other three transistors (in this case Q2, Q3, and Q4) start oscillating when the feedback voltage from windings L1, L6 becomes great enough to exert a forward bias on their base-emitter junctions.

In the FIG. 2 circuit, as in the prior art circuit, the several transistors Q1, Q2, Q3, and Q4 are connected in parallel, with their collectors connected to conductor 34, and their emitters connected through resistors R1, R6, R7, R12 to power supply lead 24. Thus, the application of the rectified line voltage through leads 24, 26 to the circuit results in appearance of voltage across capacitor C4 and primary winding L2, which are connected between lead 34 and the rectified power supply lead 26. This occurs concurrently with the biasing of the transistors to their "on" condition by resistor R3, which actually turns on transistor Q1, but produces the same response in the other transistors in view of their connection in parallel with transistor Q1 by reason of the common collector line 34. During this half cycle, windings L3, L4, through leads 36, 38 connected thereto, cause the transducer 40 to resonate in the manner disclosed in U.S. Pat. No. 3,371,233 mentioned above, the disclosure of which is incorporated herein by reference. Winding L7 is connected between the leads 36, 38.

Since resistors R4, R9, and R10 are not needed in the improved circuit shown in FIG. 2, the connecting lead 32 shown in FIG. 1, extending parallel to the lead 30, is omitted in FIG. 2.

The improved circuit, it may be noted, has greater output power than the original circuit, and transistor losses are measurably reduced.

While particular embodiments of this invention have been shown in the drawings and described above, it will be apparent that many changes may be made in the form, arrangement and positioning of the various elements of the combination. In consideration thereof it should be understood that preferred embodiments of this invention disclosed herein are intended to be illustrative only and not intended to limit the scope of the invention.

I claim:

1. In an oscillator circuit for use in resonating a transducer in a plurality of fundamental modes and the harmonics thereof, said circuit being connected to a rectified power supply by a pair of power supply leads and including a plurality of transistors connected in parallel and having high reverse base-emitter voltage breakdown values, a plurality of base bias resistors and feedback inductors providing connections for a plurality of feedback capacitors to the bases of the transistors and to one of said leads, respectively, and resistor means connected between at least one of said feedback capacitors and the other power supply lead for turning the transistors on, the improvement comprising a base drive network for the transistors in which a plurality of resistors are so connected to the feedback capacitors as to provide an alternate discharge current path for the feedback capacitors and thereby divert at least a portion of said discharge current from the transistors, said circuit including resistive connections between the emitters of the several transistors and said one of the power supply leads, the oscillator circuit further including a separate conductor connecting the collectors of the transistors in parallel, oscillator coil primary windings connected between said other power supply lead and said separate conductor, respective oscillator coil secondary windings being connected to the transducer, and respective oscillator coil feedback windings serving as said feedback inductors and providing the connections between the feedback capacitors and said one power supply lead, said improvement further comprising disposing the plurality of resistors and the feedback capacitors in sets, each of which includes at least one resistor in parallel with each feedback capacitor.

2. In an oscillator circuit as in claim 1, the further improvement wherein the turns on the respective feedback windings are numerically proportioned according to the values of each resistor-capacitor set and the high reverse base-emitter voltage breakdown values of the transistors associated therewith, to achieve a selected waveform.

3. In an oscillator circuit the improvement of claim 1 in which each resistor-capacitor set is individual to a single associated transistor and is connected to said one power supply lead through one of the feedback windings and is connected to the associated transistor through one of the base bias resistors.

4. In an oscillator circuit the improvement of claims 1, 2, or 3 in which the resistor means for turning on the several transistors comprises a single resistor connected between at least one of the feedback capacitors and said other power supply lead.

5. In an oscillator circuit the improvement of claims 1, 2, or 3 in which the resistor means for turning on the several transistors comprises a single resistor, one terminal of which is connected to said other power supply lead and the other terminal of which is connected to both the resistor and the feedback capacitor of one of said sets, the parallel connection of the collectors to said one power supply lead, and the connection of the primary windings between the other power supply lead and said separate conductor being adapted to interconnect the several transistors whereby turning on of the transistor associated with said one set is effective to turn on the remaining transistors.

* * * * *